US010957853B2

(12) United States Patent
Giannopoulos et al.

(10) Patent No.: US 10,957,853 B2
(45) Date of Patent: Mar. 23, 2021

(54) MODIFYING MATERIAL PARAMETERS OF A NANOSCALE DEVICE POST-FABRICATION

(71) Applicant: International Business Machines Corporation, Armonk, NY (US)

(72) Inventors: Iason Giannopoulos, Thalwil (CH); Abu Sebastian, Adliswil (CH); Vara S. P. Jonnalagadda, Wallisellen (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/134,482

(22) Filed: Sep. 18, 2018

(65) Prior Publication Data
US 2020/0091422 A1 Mar. 19, 2020

(51) Int. Cl.
*H01L 45/00* (2006.01)

(52) U.S. Cl.
CPC .......... *H01L 45/126* (2013.01); *H01L 45/06* (2013.01); *H01L 45/128* (2013.01); *H01L 45/1608* (2013.01)

(58) Field of Classification Search
CPC .......... H01L 51/56; H01L 51/5012; H01L 2251/558; H01L 51/0072; C09K 11/06
USPC ............................................. 257/4
See application file for complete search history.

(56) References Cited

U.S. PATENT DOCUMENTS

| 7,189,435 | B2 | 3/2007 | Tuominen et al. |
| 7,463,512 | B2 * | 12/2008 | Lung ............ G11C 11/5678 365/163 |
| 8,166,796 | B2 | 5/2012 | Clark |
| 8,569,160 | B2 | 10/2013 | Rinerson et al. |
| 9,525,132 | B1 | 12/2016 | Su |
| 9,570,169 | B1 * | 2/2017 | Czornomaz ......... G11C 13/004 |
| 9,583,702 | B2 | 2/2017 | Kim et al. |
| 9,620,710 | B2 | 4/2017 | Redaelli et al. |
| 9,837,604 | B2 | 12/2017 | Liu et al. |
| 2007/0034909 | A1 * | 2/2007 | Stasiak ............... B82Y 10/00 257/273 |
| 2012/0049144 | A1 | 3/2012 | Franceschini et al. |
| 2014/0369113 | A1 * | 12/2014 | Krebs ............... G11C 13/0004 365/163 |

(Continued)

OTHER PUBLICATIONS

Burr et al., "Recent Progress in Phase-Change Memory Technology," IEEE Journal on Emerging and Selected Topics in Circuits and Systems 6.2, 2016, pp. 146-162.

(Continued)

*Primary Examiner* — Andy Huynh
(74) *Attorney, Agent, or Firm* — Cantor Colburn LLP; Daniel Morris

(57) ABSTRACT

Embodiments of the invention are directed to a method to modify material properties of a functional material of a nanoscale device post-fabrication. The method includes performing one or more conditioning steps. The conditioning steps include applying electrical conditioning signals of predefined form to the nanoscale device, thereby performing an in-situ heating of the functional material and inducing thermally a displacement of atoms, molecules or ions of the functional material of the nanoscale device. Embodiments of the invention further concerns a related electronic device.

17 Claims, 8 Drawing Sheets

1200

(56) References Cited

U.S. PATENT DOCUMENTS

2019/0065929 A1* 2/2019 Koelmans .............. G06N 3/084
2019/0097128 A1* 3/2019 Jonnalagadda ......... H01L 45/06

OTHER PUBLICATIONS

Koelmans et al., "Projected phase-change memory devices," Nature Communications 6:8181, 2015, 7 pages.
Manca et al., "Programmable Mechanical Resonances in MEMS by Localized Joule Heating of Phase Change Materials," Advanced Materials 25.44, 2013, pp. 6430-6435.
Shu et al., "Threshold Switching in Phase-Change Materials by Picosecond Electric Fields," International Conference on Ultrafast Phenomena, Optical Society of America, 2016, 3 pages.
Wuttig et al., "Phase-change materials for rewriteable data storage," Nature Materials 6.11, 2007, pp. 824-832.

\* cited by examiner

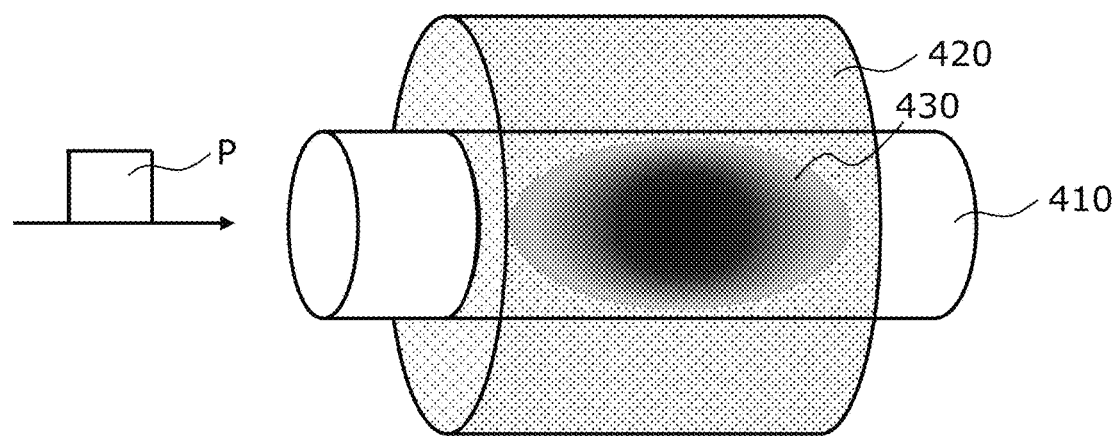
FIG. 4
400
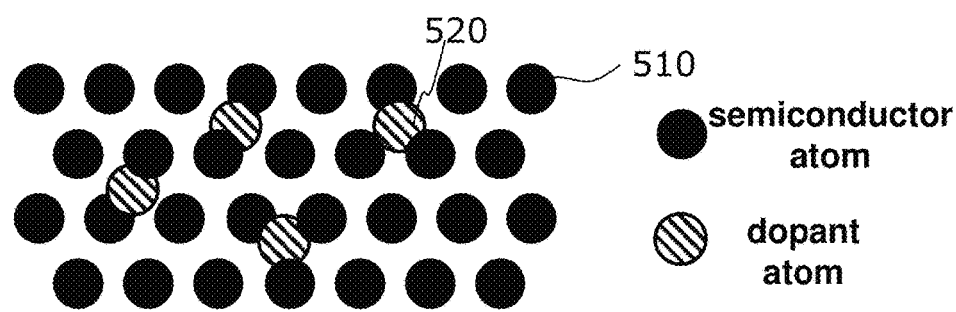
500
before activation          FIG. 5a
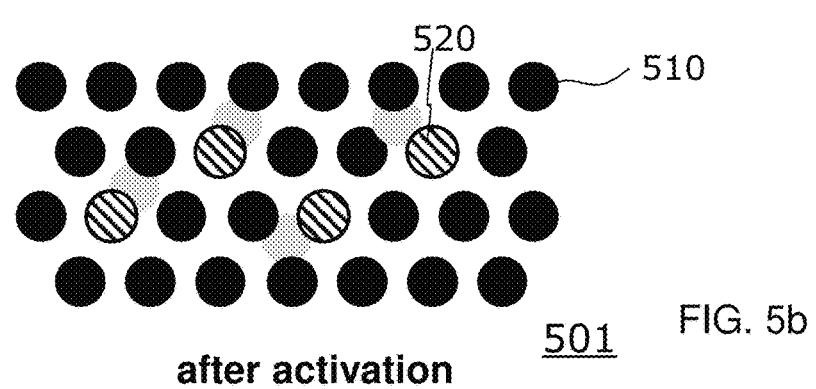
501
after activation           FIG. 5b

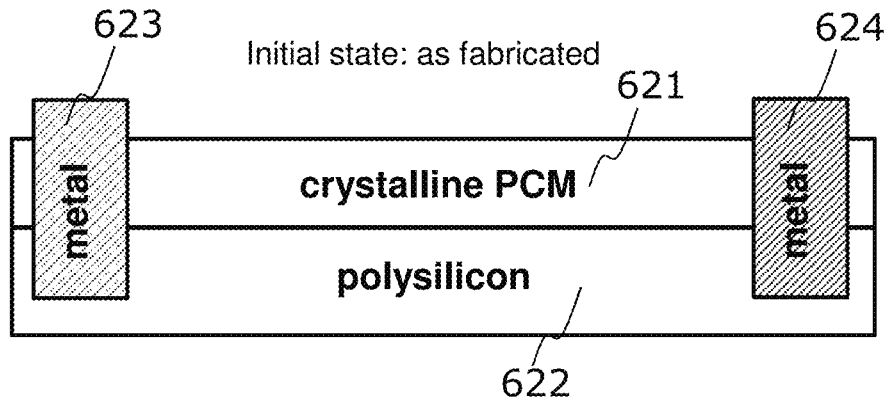
FIG. 6a
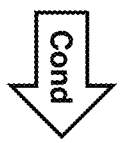
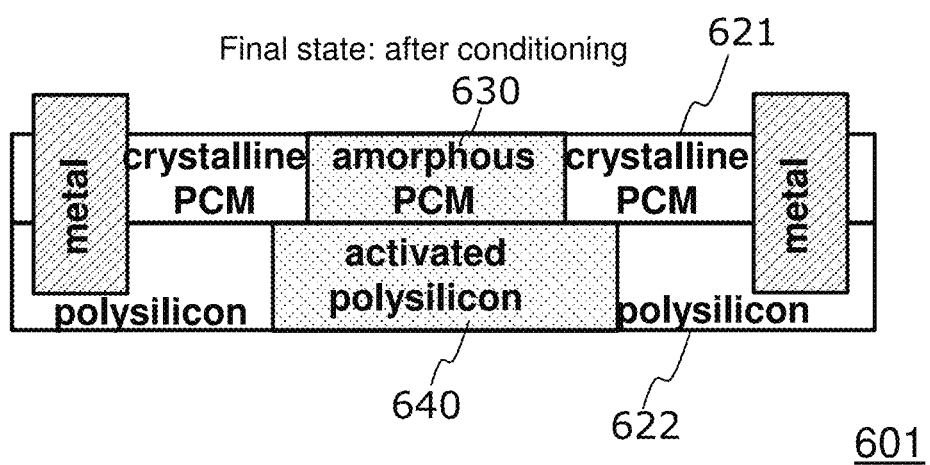
FIG. 6b

800

900

1000

1100

MODIFYING MATERIAL PARAMETERS OF A NANOSCALE DEVICE POST-FABRICATION

STATEMENT REGARDING FEDERALLY SPONSORED RESEARCH OR DEVELOPMENT

The project leading to this application has received funding from the European Union's Horizon 2020 research and innovation program under grant agreement No. ERC CoG 682675.

BACKGROUND

The invention relates in general to a method to modify material properties of a functional material of a nanoscale device post-fabrication, in particular of a nanoscale semiconductor device. The invention more specifically relates to a related electronic device and a related nanoscale semiconductor device.

Nanoscale semiconductor devices become more and more important.

As an example, nanoscale memory devices, whose resistance depends on the history of the electric signals applied, could become critical building blocks in new computing paradigms, such as brain-inspired computing and memcomputing. However, there are key challenges to overcome, such as the high programming power required, noise and resistance drift.

One promising example for nanoscale memory devices are phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to an amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state if rapidly cooled afterwards. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

The document by Wabe W. Koelmans, Abu Sebastian, Vara Prasad Jonnalagadda, Daniel Krebs, Laurent Dellmann & Evangelos Eleftheriou, Nature Communications, 6, 2015, Article number: 8181, introduces the concept of a projected memory device, whose distinguishing feature is that the physical mechanism of resistance storage is decoupled from the information-retrieval process.

However, fabricating and tuning nanoscale semiconductors devices remain challenging.

SUMMARY

According to a first aspect, the invention can be embodied as a method to modify material properties of a functional material of a nanoscale device post-fabrication. The method comprises performing one or more conditioning steps. The conditioning steps comprise applying electrical conditioning signals of predefined form to the nanoscale device, thereby performing an in-situ heating of the functional material and inducing thermally a displacement of atoms, molecules or ions of the functional material of the nanoscale device.

Embodiments of the invention use in-situ generated heat to induce thermally a displacement of atoms, molecules or ions in predefined heating areas. This may be used according to embodiments to modify the electrical, thermal and/or mechanical properties of the nanoscale device in predefined heating areas. The conditioning steps are performed post-fabrication of the device, i.e. after the fabrication process per se, but before the normal or regular operation of the device.

A nanoscale device may be defined according to embodiments as a device that at least presents one dimension (length, height, width) in the nanometer scale.

A functional material according to embodiments of the invention may be defined as a material which has properties that can be changed by the in-situ generated heat. More particularly, a functional material may be defined according to embodiments as a material that comprises atoms, molecules or ions which may be displaced thermally by the application of heat and whose properties may be changed thermally by such a displacement of the atoms, ions or molecules. The property that may be changed by the in-situ generated heat may be in particular the electrical conductivity of the functional material.

The nanoscale device may be in particular a nanoscale semiconductor device.

According to another embodiment, the step of applying electrical conditioning signals of predefined form comprises applying electrical conditioning pulses of predefined duration and predefined amplitude to the nanoscale device. In other words, the electrical conditioning signals are embodied as electrical conditioning pulses.

According to an embodiment, the method further comprises performing an in-situ doping of the functional material with dopants and activating the dopants by applying the electrical conditioning signals.

This is an elegant and efficient way to activate dopants of an in-situ doped functional material and hence to tune the resistance of the functional material to a desired value.

According to another embodiment, the method further comprises providing a layer of dopants adjacent to a layer of the functional material, diffusing the dopants from the layer of dopants into the layer of the functional material and activating the dopants in the layer of the functional material by applying the electrical conditioning signals.

This is an elegant and efficient way to activate dopants in a functional material in cooperation with an adjacent layer of dopants.

According to an embodiment, the nanoscale device is a phase change memory device. Furthermore, the phase change memory device comprises a plurality of memory cells and the plurality of memory cells comprise a first terminal, a second terminal and a phase change segment arranged between the first terminal and the second terminal. The phase change segment comprises a phase-change material for storing information in a plurality of resistance states.

According to an embodiment, the method further comprises performing an in-situ doping of the phase change segment with dopants and activating the dopants in the phase change segment by applying the electrical conditioning signals to the first terminal and the second terminal.

According to an embodiment, the method further comprises providing a layer of dopants adjacent to the phase change segment, diffusing the dopants from the layer of dopants into the phase change segment and activating the dopants in the phase change segment by applying the electrical conditioning signals to the first terminal and the second terminal.

According to an embodiment, providing the layer of dopants adjacent to the phase change segment comprises performing an atomic layer deposition of the layer of dopants on the phase change segment.

According to an embodiment, the memory cells of the phase change memory device further comprise an electrically conductive segment arranged between the first terminal and the second terminal in parallel to the phase change segment. Furthermore, the electrically conductive segments comprise dopants. In addition, the method comprises applying the electrical conditioning signals to the first terminal and the second terminal. Thereby the method performs an in-situ heating of the phase change segment and the electrically conductive segment and induces thermally an activation of the dopants within the electrically conductive segment. This lowers the resistance of the electrically conductive segment.

Such a method provides an elegant an efficient way to tune the resistance of the electrically conductive segment to a desired value.

Such an electrically conductive segment, which may also be denoted as projection segment, can be configured to provide an alternate current path during the reading of information stored in the phase change segment. Furthermore, such an electrically conductive segment can reduce the effect of resistance drift in the amorphous phase on cell read operations. The electrically conductive segment provides a parallel current path between the first terminal and the second terminal, thereby facilitating a drift-resistant operation regardless of amorphous size.

According to an embodiment, the material of the electrically conducting segment is a semiconductor material such as poly-silicon, a metal such as W or a metal nitride such as TaN, TiAlN or TiN. These materials provide good electrical properties as well as ease of manufacturing.

According to an embodiment, the phase change segment and the electrically conductive segment are arranged adjacent to each other and in electrical contact with each other over substantially the whole length between the first and the second terminal.

According to embodiments, the material of the electrically conducting segment is a doped semiconductor material. According to embodiments, the doped semiconductor material is doped polysilicon.

According to an embodiment, the conditioning signals are configured to provide a predefined energy to a predefined heating area of the functional material. The predefined energy is adapted to raise the temperature in the predefined heating area such that the thermal energy is sufficient to overcome an activation energy level of the functional material. In other words, the predefined energy is adapted to raise the temperature in the predefined heating area to a level such that the thermal energy is sufficient to overcome the activation energy of the activation mechanism associated with the functional material. The activation energy may be defined as the product of power and time that is needed to activate the functional material.

According to an embodiment, the predefined energy of the conditioning signals is higher than the energy of operating signals being applied to the nanoscale device for the normal operation of the nanoscale device. Accordingly, the conditioning signals are dedicated signals which are different from the signals that are applied during normal device operation and in particular signals of higher energy.

According to an embodiment, the conditioning pulses are configured to provide a predefined energy to a predefined heating area of the functional material that will fuel the activation mechanism, wherein the predefined energy of the conditioning pulses is higher than the energy of SET-pulses and the energy of RESET pulses being applied during a normal operation of the phase change memory device.

According to an embodiment of another aspect of the invention, a method to fabricate a nanoscale semiconductor device is provided which comprises steps of providing a semiconductor wafer, performing an initial thermal oxidation of the semiconductor wafer with a thermal budget of more than about 300 degree Celsius and fabricating a plurality of nanoscale semiconductor devices on the wafer with a thermal budget of less than about 300 degree Celsius. The method comprises further steps of performing one or more conditioning steps. The conditioning steps comprise applying electrical conditioning signals of predefined form to the semiconductor device. Thereby, an in-situ heating of the functional material is performed in a predefined heating area to a temperature of more than about 300 degree Celsius. Furthermore, a thermal displacement of atoms, molecules or ions of the functional material of the device is induced in the predefined heating area.

Such a method allows to fabricate and tune nanoscale semiconductor devices in a way that is compatible to post-CMOS/ back end of the line (BEOL) processing in terms of thermal budget.

According to an embodiment of another aspect of the invention an electronic device comprising a nanoscale device, in particular a nanoscale semiconductor device, is provided. The electronic device comprises control circuitry configured to perform one or more conditioning steps to modify material properties of a functional material of the nanoscale device post-fabrication. The conditioning steps comprise applying electrical conditioning signals of predefined form to the nanoscaledevice, thereby performing an in-situ heating of the functional material and inducing thermally a displacement of atoms, molecules or ions of the functional material of the device.

According to an embodiment, the nanoscale semiconductor device is a phase change memory device. The phase change memory device comprises a plurality of memory cells, and the plurality of memory cells comprise a first terminal, a second terminal and a phase change segment arranged between the first terminal and the second terminal. The phase change segment comprises a phase-change material for storing information in a plurality of resistance states.

According to embodiment, the memory cells may have a cylindrical shape. Such a geometry offers advantageous options in terms of design and scalability. According to an embodiment, the memory cells may be formed as multi-layer-cylinder.

Embodiments of the invention will be described in more detail below, by way of illustrative and non-limiting examples, with reference to the accompanying drawings.

BRIEF DESCRIPTION OF THE DRAWINGS

FIG. 4 shows a schematic and simplified 3-dimensional view of a nanoscale semiconductor device according to an embodiment of the invention;

FIG. 5a shows an in situ-doped semiconductor before activation;

FIG. 5b shows an in-situ doped semiconductor after activation;

FIG. 6a shows a phase change memory cell in an initial state as fabricated;

FIG. 6b shows a phase change memory cell in a conditioned state after the application of conditioning pulses;

DETAILED DESCRIPTION

In reference to FIGS. 1-15, some general aspects and terms of embodiments of the invention are described.

According to embodiments, a nanoscale semiconductor device is a device comprising a semiconductor material that has at least one dimension (length, height, width) in the nanometer scale.

According to embodiments, a functional material, in particular a functional nanomaterial, is a material that has been post-processed either chemically or physically to provide specific properties, in particular an increased conductivity with respect to the initial material.

According to embodiments of the invention, a resistive memory material may be defined as a memory material whose electrical resistance can be changed by applying an electrical signal to the resistive memory material. The resistive memory material may be e.g. a phase change material. The electrical signal may be e.g. a current flowing through the device, or an electrical voltage applied to the resistive memory device. The current and/or voltage may be e.g. applied to the resistive memory element in the form of pulses. As a result, the electrical resistance of a resistive memory element depends on the history of current that had previously flown through the device and/or the history of the electric signal that had been applied to the resistive memory element.

Resistive memory elements such as phase change memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide.

Figure 1:
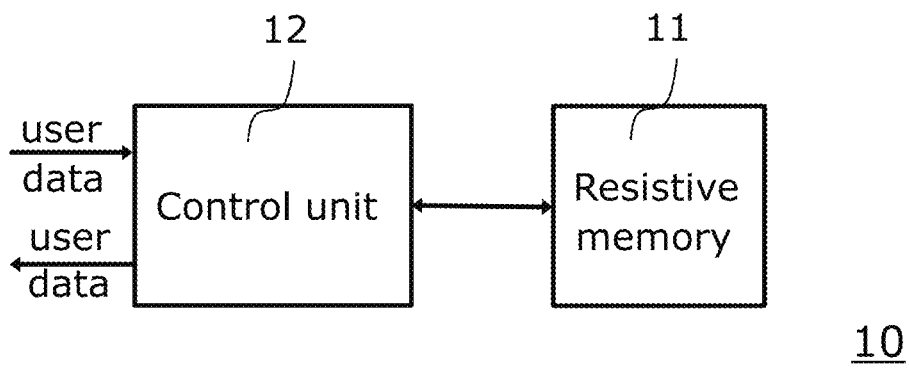
FIG. 1 illustrates a block diagram of a memory device according to an embodiment of the invention.

FIG. 1 is a simplified schematic block diagram of a memory device 10 embodying the invention. The device 10 includes a multilevel resistive memory 11 for storing data in one or more integrated arrays of resistive memory cells described below. Reading and writing of data to memory 11 is performed by a control unit 12. Control unit 12 comprises electronic circuitry for programming resistive memory cells during data write operations and making read measurements for detecting cell-state during data read operations.

In addition, control unit 12 comprises electronic circuitry for applying conditioning signals, in particular conditioning pulses during one or more conditioning steps post-fabrication, but before regular device operation.

During these operations, the control unit 12 can address individual resistive memory cells by applying appropriate control signals to an array of word and bit lines in the resistive memory 11. User data input to device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, e.g. for code-word detection and/or error correction, to recover the original input user data.

The resistive memory 11 is embodied as a phase change memory (PCM). Accordingly the resistive memory 11 comprises a plurality of PCM cells as memory cells. The PCM cells of memory 11 may store information in s=2 or in s>2 programmable resistance states, the latter providing multi-level operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the amorphous phase within the otherwise crystalline PCM material. The s programmable cell-states are typically defined in control unit 12 in terms of predetermined reference values, or ranges of values, of the resistance metric used for read detection. To program a cell in a write operation, control unit 12 applies a voltage to the cell via the word- and bit-lines such that the resulting programming signal sets the cell to the required state. In a read operation, a (lower) read voltage is applied to the cell and the resulting cell current is measured to obtain the resistance metric. Control unit 12 can then detect the programmed cell state by comparing the read metric with the aforementioned reference values.

Figure 2:
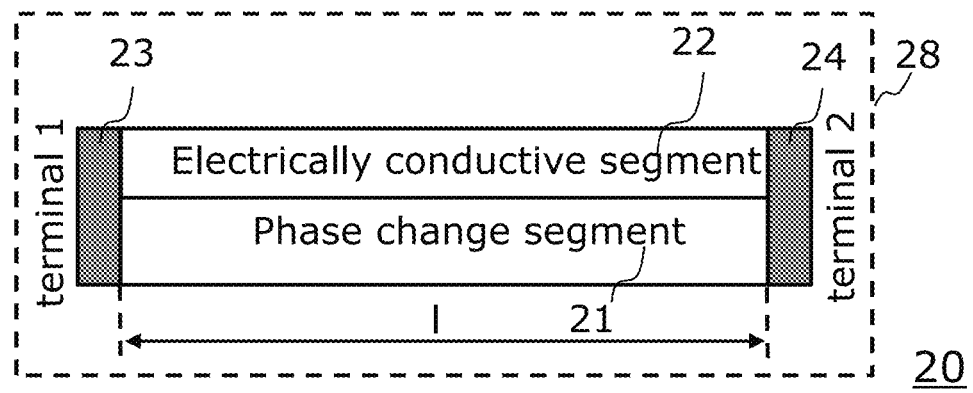
FIG. 2 shows a schematic cross sectional view of a memory cell according to an embodiment of the invention.

FIG. 2 is a schematic cross-sectional view of a memory cell 20 embodying the invention. The memory cell 20 comprises a phase change segment 21 comprising a phase change material, e.g. Sb. The memory cell 20 further comprises an electrically conductive segment 22 comprising an electrically conductive or in other words electrically non-insulating material. The phase change segment 21 and the electrically conductive segment 22 are arranged in parallel between a first terminal 23 and a second terminal 24. The first terminal 23 and the second terminal 24 are coupled to the control unit 12. The control unit 12 is adapted to apply control signals to the first terminal 23 and the second terminal 24 and to receive read-back signals from the resistive memory 11. More particularly, the control unit 12 is configured to apply in a write mode a write voltage to the first terminal 23 and the second terminal 24 for writing one of the plurality of resistance states to the memory cell. 20. The write voltage is applied in the form of voltage pulses. The voltage pulses act or serve as electrical programming pulses to program the respective resistance state of the memory cells 20. Furthermore, the control unit 12 is configured to apply in a read mode a read voltage to the first terminal 23 and the second terminal 24, thereby reading the respective resistance state of the memory cell 20. According to embodiments, the electrical resistance of the electrically conductive segment 22 may be tuned by conditioning signals being applied to the first terminal 23 and the second terminal 24 during a conditioning phase comprising one or more conditioning steps.

The phase change segment 21 and the electrically conductive segment 22 are arranged in electrical contact with each other over substantially the whole length l between the first terminal 23 and the second terminal 24. According to embodiments the resistance of the electrically conductive segment 22 forms a distributed resistance.

In an exemplary implementation of cell 20, the first terminal 23 and the second terminal 24 may be formed of TiN.

Figure 3:
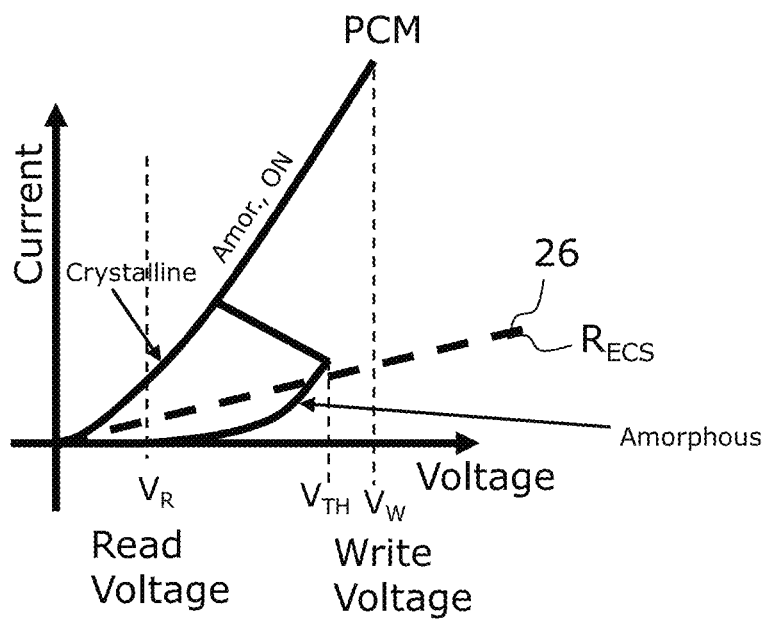
FIG. 3 illustrates voltage-current characteristics of operation modes of a memory cell according to an embodiment of the invention.

FIG. 3 is a schematic illustration of the current/voltage (and hence resistance) characteristics of the material components of the memory cell 20. The solid lines indicate variation of current with voltage for the Sb material of the phase change segment 21, starting from the fully-crystalline SET state (upper curve) and also the fully-amorphous RESET state (lower curve). These two curves reflect the large (typically 3 orders of magnitude) variation in resistivity between the crystalline and amorphous phases. The dashed line 26 in the plot indicates the current/voltage characteristic for the electrically conductive segment 22. It can be seen that, at low voltages including the cell read voltage, the resistance of the electrically conductive segment 22 is between that of the amorphous and crystalline phases of the phase change segment 21. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated. At this voltage, the ON-resistance of the phase change segment 22 is much less than the resistance $R_{ECS}$ of the electrically conductive segment 22. Accordingly, the write-current is substantially unaffected by the presence of the electrically conductive segment 22.

Based on the above principles, cell arrangements can be embodied such that, at the cell read voltage, the resistance $R_{ECS}$ of the electrically conductive segment 22 is tuned by the conditioning signals such that it is far from both the resistance Ramo of the fully-amorphous (RESET) state, and also the resistance Rcry of the fully-crystalline SET state, of the PCM material (where "far" here means far within the context of the resistance range from Rcry to Ramo). In general, an appropriate value for $R_{ECS}$ in this range will depend on various factors such as the materials and dimensions of cell components, the particular characteristics of the s programmable cell states, the operating parameters (e.g. read and write voltages) of memory device 1 as well as desired performance criteria such as maximum acceptable error-rate. In general, however, the arrangement can be such that $R_{ECS} \gg$ Rcry and $R_{ECS} \ll$ Ramo within the context of the aforementioned range.

Due to resistance characteristics described above, the effect of resistance drift in the amorphous phase on cell read operations can be significantly reduced. More particularly, the ratio of currents that flows through the phase change segment 21 and the electrically conductive segment 22 can be tuned by appropriate conditioning signals. The electrically conductive segment 22 provides a full parallel current path between the terminals 23, 24, providing drift-resistant operation regardless of amorphous size. Moreover, any residual drift effect (due to the very small current flowing through the amorphous phase) will exhibit low variability at different cell states. By choosing the resistance of the full parallel current path the very small current flowing through the amorphous phase can be tuned and it can be ensured that current through the electrically conductive segment 22 will dominate as desired.

In effect, the programmed resistance state of the memory cell 20 can be considered to be projected onto the resistance of the electrically conductive segment 22 in a read operation. During the low-field read process, the current bypasses the highly resistive amorphous region of the phase change segment 21 and flows through that part of the electrically conductive segment 22 that is parallel to it. Accordingly the length of the current path through the electrically conductive segment 22 reflects the amorphous size and hence the programmed resistance state. In other words, the electrically conductive segment 22 may be considered as a projection segment during the read operation. The information that is typically stored into the length of the amorphous region in the phase change segment 21 is in a sense projected onto the electrically conductive segment 22.

It should be noted that even though the electrically conductive segment 22 is present during both the read and the write operation, according to embodiments the "projection" is designed to occur only during the read process. In effect, therefore, embodiments of the invention provide a decoupling of the read process and the write process.

As mentioned above, the control unit 12 is configured to apply in a write mode write voltages as electrical programming pulses to the first terminal 23 and the second terminal 24.

FIG. 4 shows a schematic and simplified 3-dimensional view of a nanoscale semiconductor device 400 according to an exemplary embodiment of the invention. The semiconductor device 400 has a cylindrical shape and may represent a memory cell. The semiconductor device 400 is formed as multilayer-cylinder comprising an inner cylinder 410. The inner cylinder 410 may comprise in particular a material that generates heat when conditioning signals are applied to the device 400, in particular a phase change material forming a phase change segment. The memory cell 400 further comprises an outer cylinder 420 which may comprise in particular an electrically conductive segment comprising a functional material, e.g. a doped semiconductor material. The outer cylinder 420 is formed as hollow cylinder.

By the application of electrical conditioning pulses P to the phase change segment of the inner cylinder 410, heat is generated within the device 400. An exemplary heat distribution 430 is illustrated by an oval shape, wherein darker areas represent a higher temperature than lighter areas. As a result, an in-situ heating of the functional material in the outer cylinder 420 is performed which may thermally displace and activate e.g. dopants in the outer cylinder 420.

Accordingly, the heat that is generated inside the inner cylinder 410 is used in a directed way to alter the properties of the material in the outer cylinder 420. In that that way, the temperature raises at the levels that are required to change the properties of the materials in the outer cylinder 420 not by heating up the whole device 400, but in a local and controlled manner.

FIG. 5a and FIG. 5b illustrate an activation of dopants in a nanoscale semiconductor device, more particularly an in-situ doping. FIG. 5a shows an in situ-doped semiconductor device 500 before activation and FIG. 5b a semiconductor device 501 after activation.

The semiconductor device 500 comprises semiconductor atoms 510 which are illustrated by black dots and may be e.g. Si-atoms. The semiconductor device 500 furthermore comprises dopant atoms 520 which are illustrated by a diagonal pattern and may be e.g. phosphor atoms.

The dopant atoms 520 are introduced while the semiconductor is grown during the deposition method, which may be e.g. "plasma-enhanced chemical vapor deposition" (PECVD) of polysilicon. Polycrystalline materials consist of crystallites, i.e. small volumes with crystalline structure which are merged. Within the crystallite, the dopant atoms 520 are initially an interstitial impurity, i.e. they are not in one of the lattice positions as shown in FIG. 5a. Therefore, its electronic properties do not contribute to the semiconductor.

Activation is the process when the dopant atoms 520 substitute the semiconductor atoms 510 in the lattice positions. Then they alter the electronic properties of the semiconductor, e.g. the conductivity. Such an activated semiconductor device 501 is shown in FIG. 5b.

FIG. 6a and FIG. 6b show an exemplary cross sectional view of a phase change memory cell. FIG. 6a shows a phase change memory cell 600 in an initial state as fabricated and FIG. 6b a phase change memory cell 601 in a conditioned state after the application of conditioning pulses.

The memory cells 600, 601 comprise a first terminal 623, a second terminal 624, a phase change segment 621 and an electrically conductive segment 622. The first terminal 623 and the second terminal 624 may comprise in particular a metal. In the initial state after fabrication, the phase change segment 621 comprises a crystalline phase change material and the electrically conductive segment 622 comprises non-activated doped polysilicon as functional material.

By the application of one or more conditioning pulses, the phase change material of the phase change segment 621 has been heated up and partly brought into an amorphous state and accordingly comprises an amorphous phase change material in an area 630.

Furthermore, the heat generated by the conditioning pulses in the phase change segment 621, has also performed an in-situ heating of the functional material of the electrically conductive segment 622, in particular in a predefined heating area 640. Accordingly, in the heating area 640 the doped polysilicon has been activated. More particularly, the corresponding dopant atoms of the polysilicon have substituted the Si- atoms in the lattice positions. Thereby, the resistance of the electrically conductive segment 622 has been lowered.

Figure 7A:
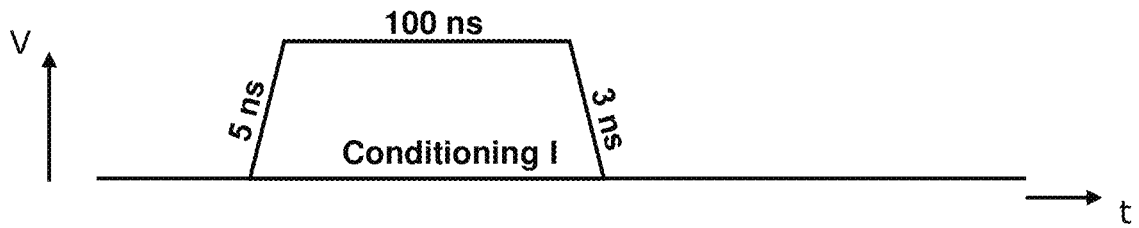
FIG. 7a and FIG. 7b illustrate electrical conditioning pulses of predefined duration and predefined amplitude.
Figure 7B:
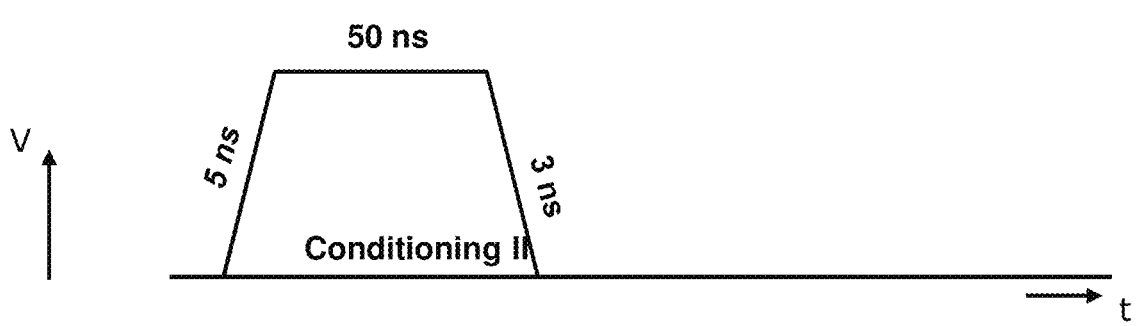

FIG. 7a and FIG. 7b illustrate electrical conditioning pulses of predefined duration and predefined amplitude being applied to a semiconductor device according to methods of embodiments of the invention. More particularly, FIG. 7a shows a conditioning pulse 710 that has a length of e.g. 100 ns, a rising slope with a duration of 5 ns and a falling slope with a duration of 3 ns. The amplitude may be e.g. 1.8V.

FIG. 7b shows a conditioning pulse 720 that has a shorter length of 50 ns, a rising slope with a duration of 5 ns and a falling slope with a duration of 3 ns. However, the amplitude is higher than the amplitude of the pulse 710, e.g. 1.5V.

The conditioning pulses 710 and 720 are configured to provide a predefined activation energy to the predefined heating area(s) of the functional material whose properties shall be changed. In particular, the predefined activation energy is chosen such that it raises the temperature elevation in the predefined heating area(s) to an activation energy level of the functional material. The activation energy is the product of heating power and time required for the respective activation of the functional material.

The predefined activation energy of the conditioning pulses 710 and 720 is higher than the energy of operating signals being applied to the semiconductor device for the normal operation of the semiconductor device.

Figure 7C:
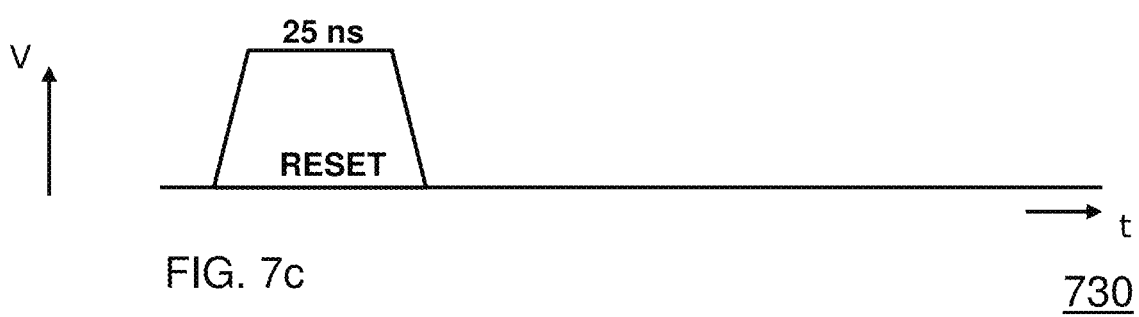
FIG. 7c shows an exemplary RESET pulse of a normal device operation.
Figure 7D:
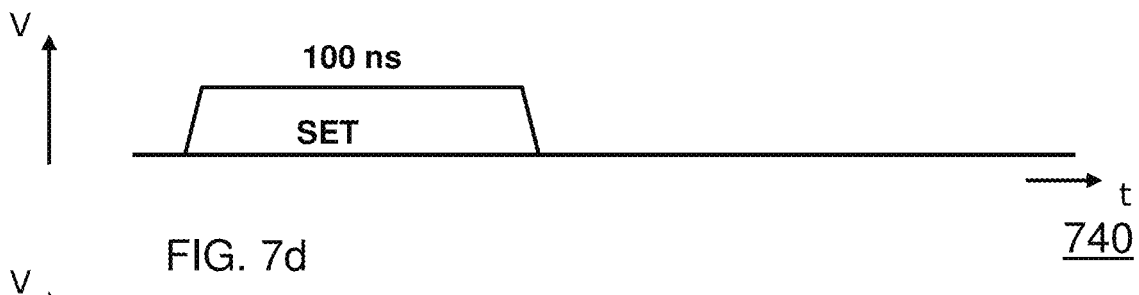
FIG. 7d shows an exemplary SET-pulse of a normal device operation.
Figure 7E:
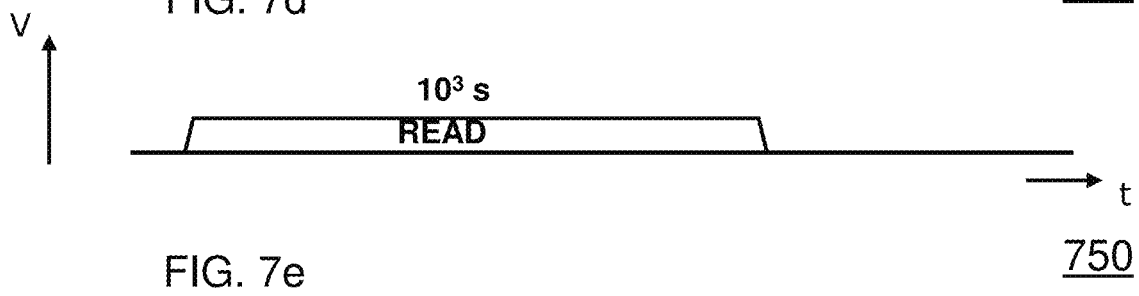
FIG. 7e shows an exemplary READ pulse of a normal device operation.

This is illustrated for a phase change memory device in FIGS. 7c, 7d and 7e.

FIG. 7c shows an exemplary RESET pulse of a duration of 25 ns and an exemplary amplitude of e.g. 1.0V.

FIG. 7d shows an exemplary SET-pulse 740 of a duration of 100 ns and an exemplary amplitude of e.g. 0.7V.

FIG. 7e shows an exemplary READ pulse 750 of a duration of 100 ns and an amplitude of e.g. 50 mV.

It should be noted that the pulses shown in FIGS. 7a to 7e are not to scale and only shown to illustrate some principles according to embodiments of the invention in an exemplary way. Generally all the voltage values are functions of the material's resistance and volume.

The energy provided by the conditioning pulses 710 and 720 is above the predefined activation energy. The energy provided by the RESET-pulse 730, the SET-pulse 740 and the READ—pulse is below the predefined activation energy and smaller than the energy of the conditioning pulses 710 and 720 which are applied during a normal operation of the phase change memory device.

Figure 8:
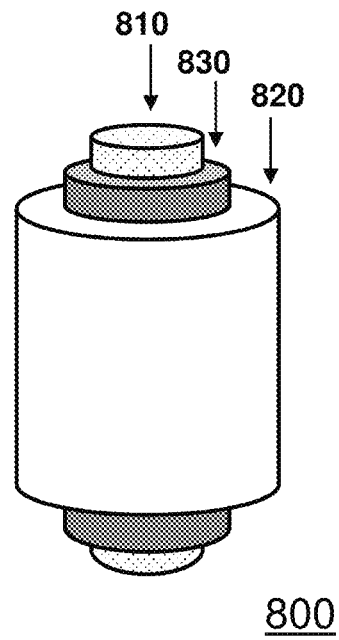
FIG. 8 shows a schematic and simplified 3-dimensional view of a cylindrical nanoscale semiconductor device according to an exemplary embodiment of the invention.

FIG. 8 shows a schematic and simplified 3-dimensional view of a nanoscale semiconductor device 800 according to an exemplary embodiment of the invention. The semiconductor device 800 has a cylindrical shape and shall represent a memory cell. The memory cell 800 is formed as multilayer-cylinder comprising an inner cylinder 810. The inner cylinder 810 may comprise in particular a material that generates heat when conditioning signals are applied to the device 800, in particular a phase change material forming a phase change segment. The memory cell 800 further comprises an outer cylinder 820 which may comprise in particular an electrically conductive segment comprising a functional material, e.g. a doped semiconductor material. The outer cylinder 820 is formed as hollow cylinder.

In addition, the memory cell 800 comprises an intermediate cylinder 830 which may comprise an additional material that may be tunable or not and that may be miscible or immiscible with the heat generating material.

By the application of electrical conditioning pulses to the phase change memory cell 800, heat is generated by the inner cylinder 810, which is distributed via the intermediate cylinder 830 to the outer cylinder 820. Thereby, one or more characteristics of the outer cylinder 820 may be tuned, in particular the conductivity of the outer cylinder 820.

Figure 9:
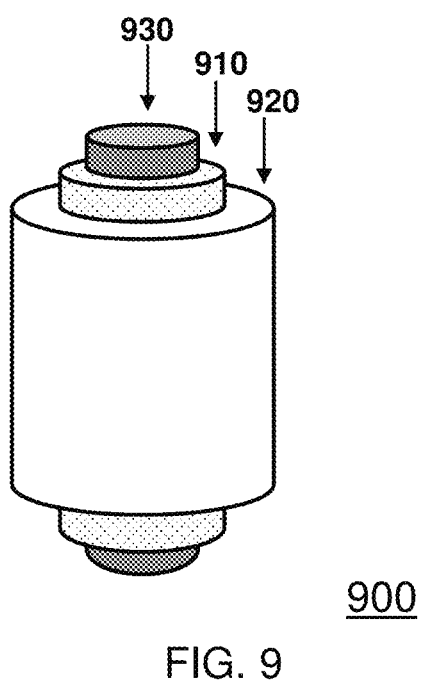
FIG. 9 shows a schematic and simplified 3-dimensional view of another cylindrical nanoscale semiconductor device according to an exemplary embodiment of the invention.

FIG. 9 shows a schematic and simplified 3-dimensional view of a nanoscale semiconductor device 900 according to another exemplary embodiment of the invention. The semiconductor device 900 has a cylindrical shape and may also represent a memory cell. The memory cell 900 is formed as multilayer-cylinder comprising an intermediate cylinder 910. The intermediate cylinder 910 may comprise in particular a material that generates heat when conditioning signals are applied to the device 900, in particular a phase change material forming a phase change segment. The memory cell 900 further comprises an outer cylinder 920 which may comprise in particular an electrically conductive segment comprising a functional material, e.g. a doped semiconductor material. The outer cylinder 920 is formed as hollow cylinder.

In addition, the memory cell 900 comprises an inner cylinder 930 which may comprise an additional material that may be tunable or not and that may be miscible or immiscible with the heat generating material.

By the application of electrical conditioning pulses to the phase change memory cell 900, heat is generated by the intermediate cylinder 910 which tunes one or more characteristics of the outer cylinder 920, in particular the conductivity of the outer cylinder 920.

In the latter example the heat generating intermediate cylinder 910 and the tuned cylinder 920 are directly attached to each other, while in the embodiment of FIG. 8 the intermediate cylinder 830 is arranged between the heat generating cylinder 810 and the tuned cylinder 820.

Figure 10:
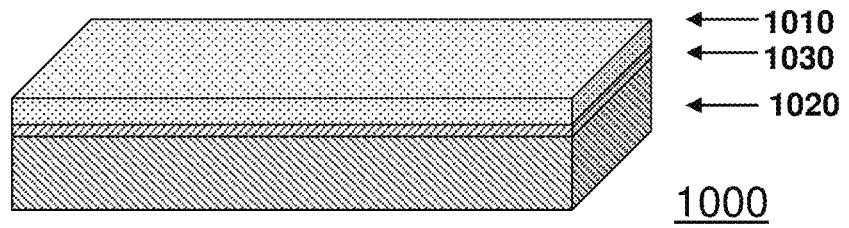
FIG. 10 shows a schematic and simplified 3-dimensional view of a cube-shaped nanoscale semiconductor device according to an exemplary embodiment of the invention.

FIG. 10 shows a schematic and simplified 3-dimensional view of a nanoscale semiconductor device 1000 according to an exemplary embodiment of the invention. The semiconductor device corresponds to the semiconductor device 800 of FIG. 8, but has a cube-shaped or box-shaped form instead of the cylindrical shape. The semiconductor device 1000 may also represent a memory cell. The memory cell 1000 has an upper layer 1010 which may comprise in particular a material that generates heat when conditioning signals are applied to the device 1000, in particular a phase change material forming a phase change segment. The memory cell 1000 further comprises a lower layer 1020 which may comprise in particular an electrically conductive segment comprising a functional material, e.g. a doped semiconductor material. In addition, the memory cell 1000 comprises an intermediate layer 1030 which may comprise an additional material that may be tunable or not and that may be miscible or immiscible with the heat generating material.

Figure 11:
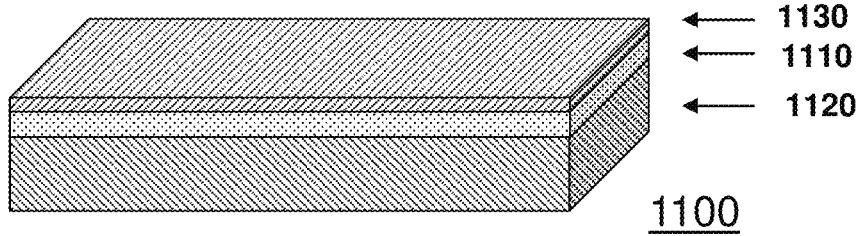
FIG. 11 shows a schematic and simplified 3-dimensional view of another cube-shaped nanoscale semiconductor device according to an exemplary embodiment of the invention.

FIG. 11 shows a schematic and simplified 3-dimensional view of a nanoscale semiconductor device 1100 according to an exemplary embodiment of the invention. The semiconductor device 1110 corresponds to the semiconductor device 900 of FIG. 9, but has a cube-shaped or box-shaped form instead of the cylindrical shape. The semiconductor device 1100 may also represent a memory cell. The memory cell 1100 has an intermediate layer 1110 which may comprise in particular a material that generates heat when conditioning signals are applied to the device 1100, in particular a phase change material forming a phase change segment. The memory cell 1100 further comprises a lower layer 1120 which may comprise in particular an electrically conductive segment comprising a functional material, e.g. a doped semiconductor material. In addition, the memory cell 1100 comprises an upper layer 1130 which may comprise an additional material that may be tunable or not and that may be miscible or immiscible with the heat generating material.

Figure 12A:
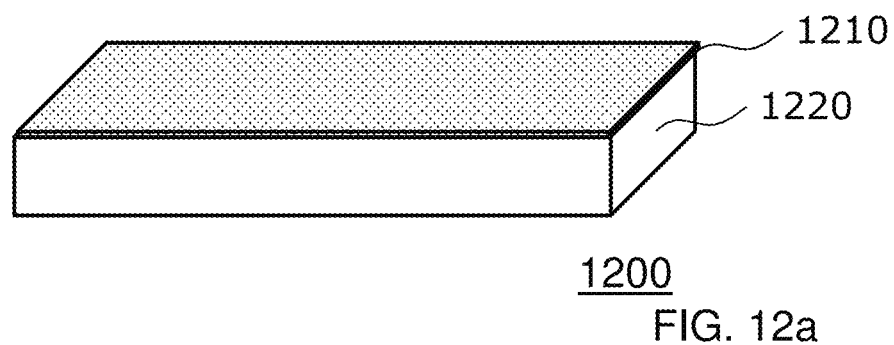
FIG. 12a shows a schematic and simplified 3-dimensional view of a nanoscale semiconductor comprising a dopant layer adjacent to a phase change memory layer.
Figure 12B:
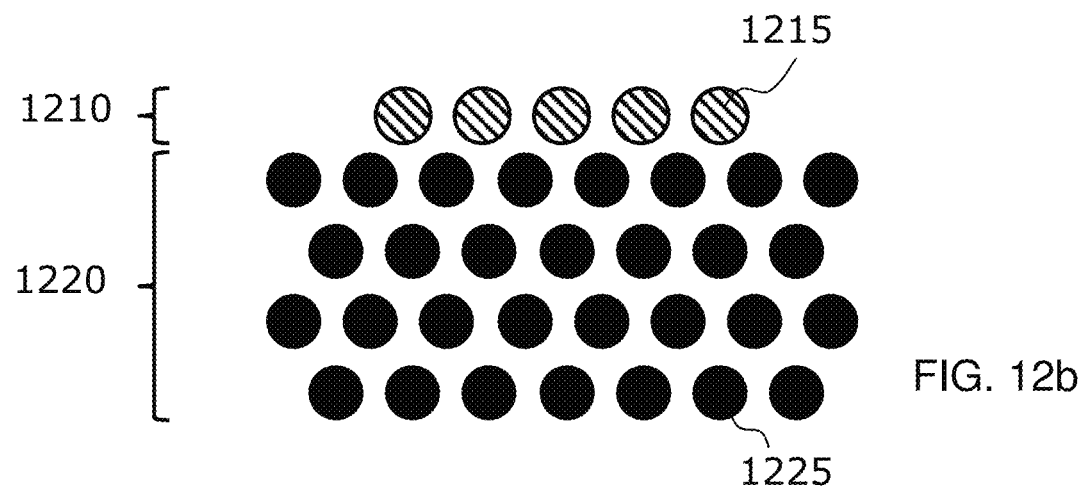
FIG. 12b show a corresponding schematic atomic view before the activation of the dopants.
Figure 12C:
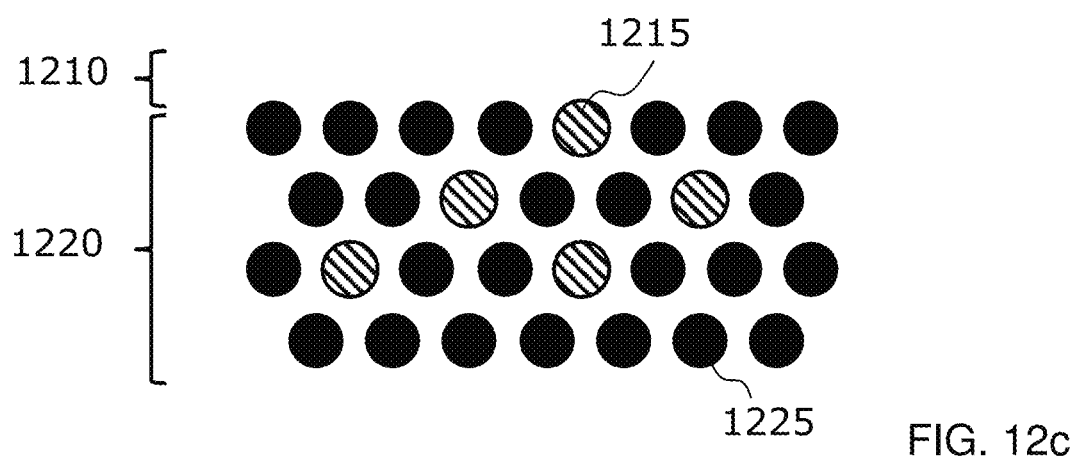
FIG. 12c shows a corresponding schematic atomic view after the activation of the dopants.

FIGS. 12*a*, 12*b* and 12*c* illustrate a method according to an embodiment of the invention according to which a layer of dopants is provided adjacent to a phase change segment for subsequent activation by conditioning pulses.

FIG. 12*a* shows a schematic and simplified 3-dimensional view of a nanoscale semiconductor device 1200. The semiconductor device 1200 has a cube-shaped or box-shaped form and comprises a layer of dopants 1210 adjacent to a layer 1220 forming a phase change segment.

FIG. 12*b* show a corresponding schematic atomic view before the activation of the dopants and FIG. 12*c* a corresponding schematic atomic view after the activation of the dopants.

More particularly the layer 1210 comprises dopant atoms 1215 which are illustrated by a diagonal pattern and may be e.g. phosphor atoms. Furthermore, the layer 1220 comprises semiconductor atoms 1225 which are illustrated by black dots and may be e.g. Si-atoms. By the application of conditioning pulses the dopant atoms 1215 diffuse from the layer of dopants 1210 into the phase change segment 1220 and are furthermore activated which is shown in FIG. 12*c*. The layer of dopants 1210 may be deposited on the phase change segment e.g. by atomic layer deposition (ALD).

Figure 13:
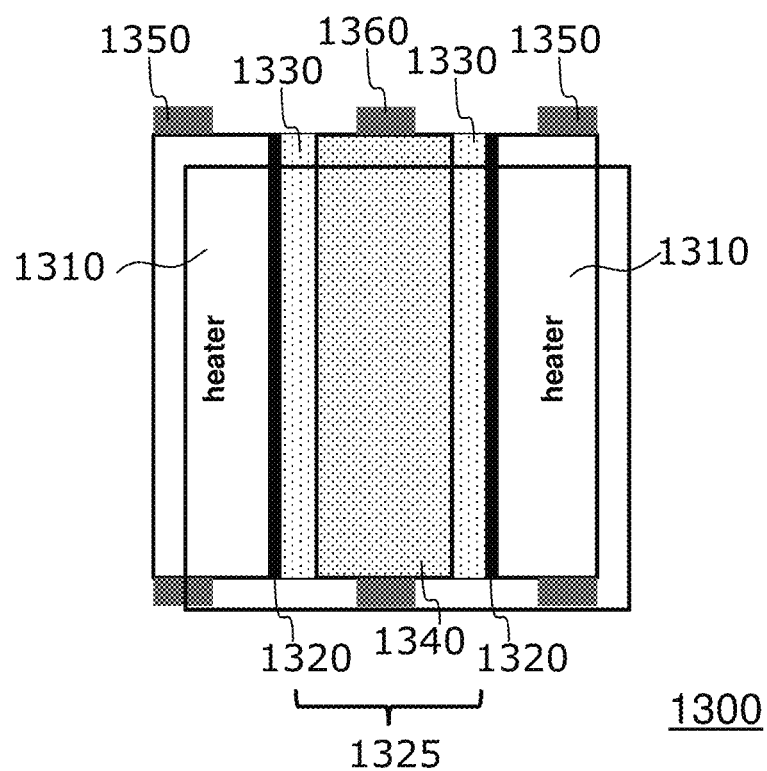
FIG. 13 shows a schematic cross sectional view of a nanoscale semiconductor device according to another embodiment of the invention having a separate heater.

FIG. 13 shows a schematic cross sectional view of a nanoscale device 1300 according to an embodiment of the invention. The device 1300 may have a cylindrical or cubic shape and comprises outer layers 1310 which are embodied as heater and comprise a heat-generating material, e.g. a phase change material. Adjacent to the outer layers 1310 thin layers 1320 are arranged which form insulating layers and electrically isolate an inner active device area 1325 from the heater.

The layers 1320 also act as a diffusion barrier, i.e. they are impermeable by atoms of the inner active device area 1325.

The device 1300 further comprises layers 1330 which comprise dopants or alloy elements and an inner layer 1340 which comprises a functional material that shall be doped or that shall form an alloy with the alloy elements. The functional material can be a semiconductor. The device further comprises conditioning electrodes 1350 to which the conditioning signals are applied in order to condition the device 1300. Furthermore, the device 1300 comprises operational electrodes 1360 to which operating signals are applied during the operation of the device.

Hence in devices embodied as the device 1300 the heater is individually connected to raise the temperature on demand via dedicated electrical connections. However, the thermal conductivity of the material of the layer 1320 (insulating layer) has to be high enough to transfer heat to the inner active device area 1325.

Figure 14:
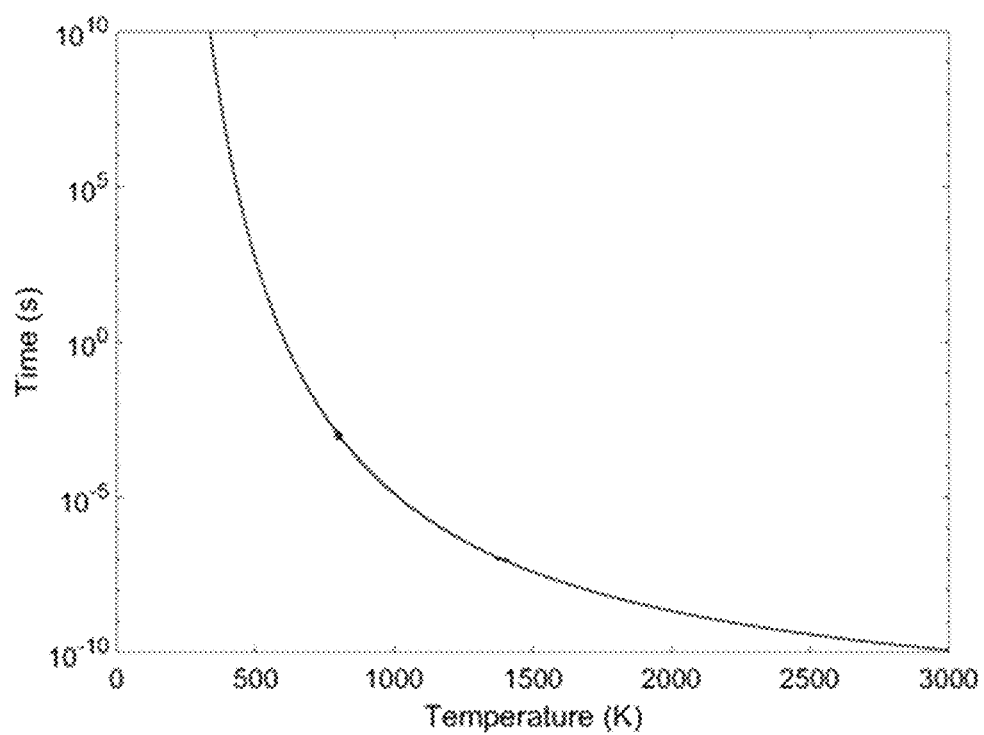
FIG. 14 shows a graph illustrating an Arrhenius plot.

FIG. 14 shows a graph comprising an Arrhenius plot showing the relation between activation temperature and time of a dopant material.

As can be seen in FIG. 14, activation is a function of time and temperature. A lower temperature requires a longer activation time. The characteristic quantity is the activation energy $E_b$. In FIG. 14 it is assumed that the activation process can be described by the Arrhenius equation which has the form:

$$\tau_a(T) = \tau_0 e^{\frac{E_b}{K_B T}}$$

wherein $\tau_a$ captures the time for activation at a certain temperature (T), T is the temperature, $\tau_0$ is the pre-exponential factor (extrapolation to T=∞) and $K_B$ is the Boltzmann constant.

The time-temperature Arrhenius plot in FIG. 14 shows that dopants may be activated in a very short time if the temperature is adequately raised.

The memory cells of FIGS. 2, 4, 6a, 6b and 8-13 can be fabricated using well-known material processing techniques for formation of the various elements of the cell. By way of example, the cylindrical structure may be produced by a keyhole-transfer process as described in Raoux et al., IBM J. Res. & Dev. 52(4/5), 465 (2008), (see FIG. 6 thereof). In general, however, the materials and dimensions of the cells are selected to satisfy the particular needs of the respective application.

Figure 15:
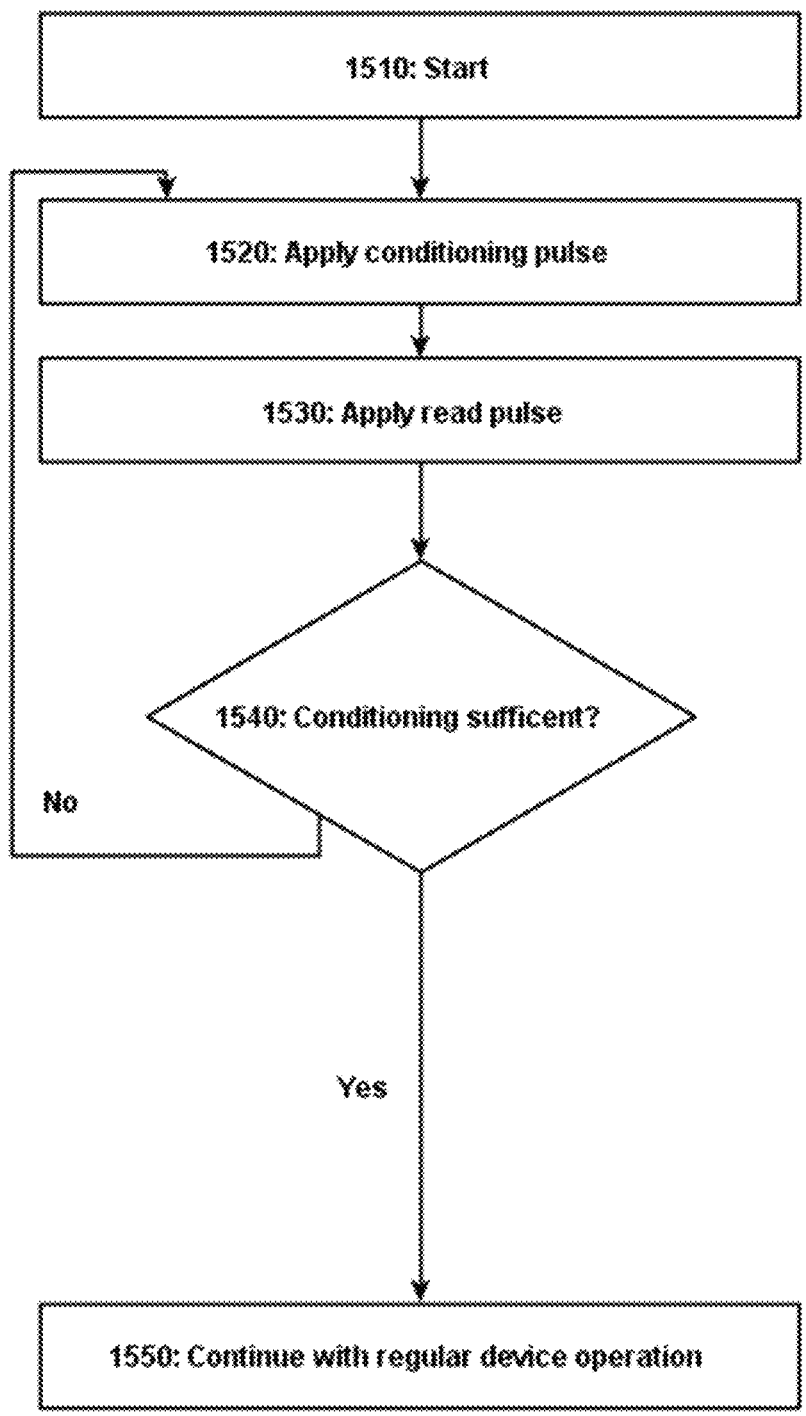
FIG. 15 shows a flow chart of method steps of a method for conditioning a nanoscale semiconductor device according to an embodiment of the invention.

FIG. 15 shows a flow chart of method steps of a method for conditioning a nanoscale semiconductor device, e.g. the resistive memory 11 of FIG. 1.

At a step 1510, the method is started.

At a step 1520, the control unit 12 applies one or more electrical conditioning signals of predefined form to the resistive memory 11. This results in an in-situ heating of the functional material of the resistive memory 11 in a predefined heating area and induces thermally a displacement of atoms, molecules or ions of the functional material of the semiconductor device in the predefined heating area.

At a step 1530, the control unit 12 applies a read pulse to the resistive memory 11, e.g. to read a resistance state of an electrically conductive segment (projection segment).

At a step 1540, the control unit 12 checks whether the conditioning is sufficient, i.e. for example whether the resistance of the projection segment has reached a desired value.

If this is the case, the method continues at a step 1550 with the regular device operation, e.g. with a regular memory operation.

If the conditioning is not yet sufficient, the method continues with another step 1520 and accordingly one or more further conditioning pulses are applied.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments.

In general, modifications described for one embodiment may be applied to another embodiment as appropriate.

What is claimed is:

1. A method to modify material properties of a functional material of a nanoscale device post-fabrication, the method comprising:
    providing a layer of dopants adjacent to a layer of the functional material; and
    performing one or more conditioning steps, the conditioning steps comprising:
        applying electrical conditioning signals of predefined form to the nanoscale device, thereby performing an in-situ heating of the functional material, wherein the in-situ heating diffuses the dopants from the layer of dopants into the layer of the functional material, activates the dopants, and induces thermally a displacement of atoms, molecules or ions of the functional material.

2. A method according to claim 1, wherein applying electrical conditioning signals of predefined form comprises applying electrical conditioning pulses of predefined duration and predefined amplitude to the nanoscale device.

3. A method according to claim 2, wherein the conditioning pulses are configured to provide a predefined energy to a predefined heating area, wherein the predefined energy of the conditioning pulses is higher than the energy of SET-pulses and the energy of RESET pulses being applied during a normal operation of the phase change memory device.

4. A method according to claim 1, wherein diffusing the dopants comprises an in-situ doping of the functional material.

5. A method according to claim 1, wherein the nanoscale device comprises a phase change memory device, the phase change memory device comprises a plurality of memory cells, and each of the plurality of memory cells comprises:
    a first terminal;
    a second terminal; and
    a phase change segment arranged between the first terminal and the second terminal, the phase change segment comprising a phase-change material for storing information in a plurality of resistance states.

6. A method according to claim 5 further comprising:
    performing an in-situ doping of the phase change segment with dopants; and
    activating the dopants in the phase change segment by applying the electrical conditioning signals to the first terminal and the second terminal.

7. A method according to claim 5 further comprising:
    providing a layer of dopants adjacent to the phase change segment;
    diffusing the dopants from the layer of dopants into the phase change segment; and
    activating the dopants in the phase change segment by applying the electrical conditioning signals to the first terminal and the second terminal.

8. A method according to claim 7, wherein providing the layer of dopants adjacent to the phase change segment comprises performing an atomic layer deposition of the layer of dopants on the phase change segment.

9. A method according to claim 5, wherein the memory cells of the phase change memory device further comprise an electrically conductive segment arranged between the first terminal and the second terminal in parallel to the phase change segment, the electrically conductive segments comprising dopants; wherein the method comprises:

applying the electrical conditioning signals to the first terminal and the second terminal, thereby performing an in-situ heating of the phase change segment and the electrically conductive segment; and inducing thermally an activation of the dopants within the electrically conductive segment, thereby lowering the resistance of the electrically conductive segment.

10. A method according to claim 9, wherein the material of the electrically conducting segment comprises a doped semiconductor material.

11. A method according to claim 10, wherein the doped semiconductor material comprises doped polysilicon.

12. A method according to claim 1, wherein the conditioning signals are configured to provide a predefined energy to a predefined heating area, the predefined energy being adapted to raise the temperature in the predefined heating area such that the thermal energy is sufficient to overcome an activation energy level of the functional material.

13. A method according to claim 12, wherein the predefined energy of the conditioning signals is higher than the energy of operating signals being applied to the nanoscale device for the normal operation of the nanoscale device.

14. An electronic device comprising a nanoscale phase change memory device, the electronic device comprising:
a plurality of memory cells, the plurality of memory cells comprising:
a first terminal;
a second terminal;
a phase change segment arranged between the first terminal and the second terminal, the phase change segment comprising a phase-change material for storing information in a plurality of resistance states; and
an electrically conductive segment arranged between the first terminal and the second terminal in parallel to the phase change segment, the electrically conductive segment comprising dopants; and
control circuitry configured to perform one or more conditioning steps to modify material properties of a functional material of the nanoscale phase change memory device post-fabrication, the conditioning steps comprising:
applying electrical conditioning signals of predefined form to the first terminal and the second terminal, thereby performing an in-situ heating of the phase change segment and the electrically conductive segment; and
inducing thermally an activation of the dopants of the electrically conductive segment, thereby lowering the resistance of the electrically conductive segment.

15. An electronic device according to claim 14, wherein the control circuitry is configured to apply as conditioning signals electrical conditioning pulses of predefined duration and predefined amplitude to the nanoscale device.

16. A method to modify material properties of a functional material of a nanoscale device post-fabrication, the method comprising:
performing one or more conditioning steps, the conditioning steps comprising:
applying electrical conditioning signals of predefined form to the semiconductor device, thereby performing an in-situ heating of the functional material; and
inducing thermally a displacement of atoms, molecules or ions of the functional material of the nanoscale device in the functional material;
wherein the conditioning signals are configured to provide a predefined energy to a predefined heating area, the predefined energy being adapted to raise the temperature in the predefined heating area such that the predefined energy is sufficient to overcome an activation energy level of the functional material.

17. A method according to claim 16, wherein the predefined energy of the conditioning signals is higher than the energy of operating signals being applied to the nanoscale device for the normal operation of the nanoscale device.

* * * * *